US005617370A

United States Patent [19]
Ishikawa

[11] Patent Number: 5,617,370
[45] Date of Patent: Apr. 1, 1997

[54] SEMICONDUCTOR MEMORY DEVICE WITH CONTROLLABLE CHARGING CHARACTERISTICS OF COLUMN LINES

[75] Inventor: Kimiyasu Ishikawa, Kumamoto, Japan

[73] Assignee: NEC Corporation, Tokyo, Japan

[21] Appl. No.: 549,388

[22] Filed: Oct. 27, 1995

[30] Foreign Application Priority Data

Oct. 28, 1994 [JP] Japan ................................ 6-265568

[51] Int. Cl.$^6$ ........................................................ A11C 8/00
[52] U.S. Cl. ........................ 365/233.5; 365/233; 365/94
[58] Field of Search ................................ 365/233.5, 94, 365/233

[56] References Cited

FOREIGN PATENT DOCUMENTS

5182487  7/1993  Japan ................................ 313/440

Primary Examiner—David C. Nelms
Assistant Examiner—F. Nirandan

[57] ABSTRACT

A semiconductor device has memory cells, a bias circuit and a charging circuit. A conductive or non-conductive state of the memory cells is read out by the bias circuit and the charging circuit as data in the memory cells. The device also includes a control circuit having a supply voltage detection circuit in which a first N-channel depletion-mode MOSFET whose drain and gate electrodes are connected in common, and a second N-channel depletion-mode MOSFET whose source and gate electrodes are connected in common, are connected in series between the power supply terminal and the ground potential terminal. The series junction node formed between the first and second MOSFETs is connected to one input terminal of a NOR gate while an inverted signal line for a semiconductor device enabling signal is connected to the other input terminal, and an output terminal of the NOR gate is connected to an input terminal of an inverter, an output of the inverter being used as a control signal for enabling the charging circuit. This provides a semiconductor device with optimal performance characteristics even when there are different operating power supply voltages without a need for changing mask patterns.

5 Claims, 5 Drawing Sheets

Fig. 6

# SEMICONDUCTOR MEMORY DEVICE WITH CONTROLLABLE CHARGING CHARACTERISTICS OF COLUMN LINES

BACKGROUND OF THE INVENTION

1. Field of the Invention

The present invention relates to a semiconductor device whose main elements are MOS type field effect transistors (hereinafter referred to as "MOSFET"), and more particularly to a semiconductor memory device in which charging characteristics for column lines can easily be changed in response to changes in the power supply voltage.

2. Description of the Related Art

Generally, in the read only memory element with which the data writing is carried out in a predetermined process step among the fabricating process steps of a semiconductor, there is a memory called a mask ROM (Read Only Memory). In this mask ROM, data is stored by selectively changing a threshold voltage of each of the MOSFETs during the fabrication process.

Figure 2:
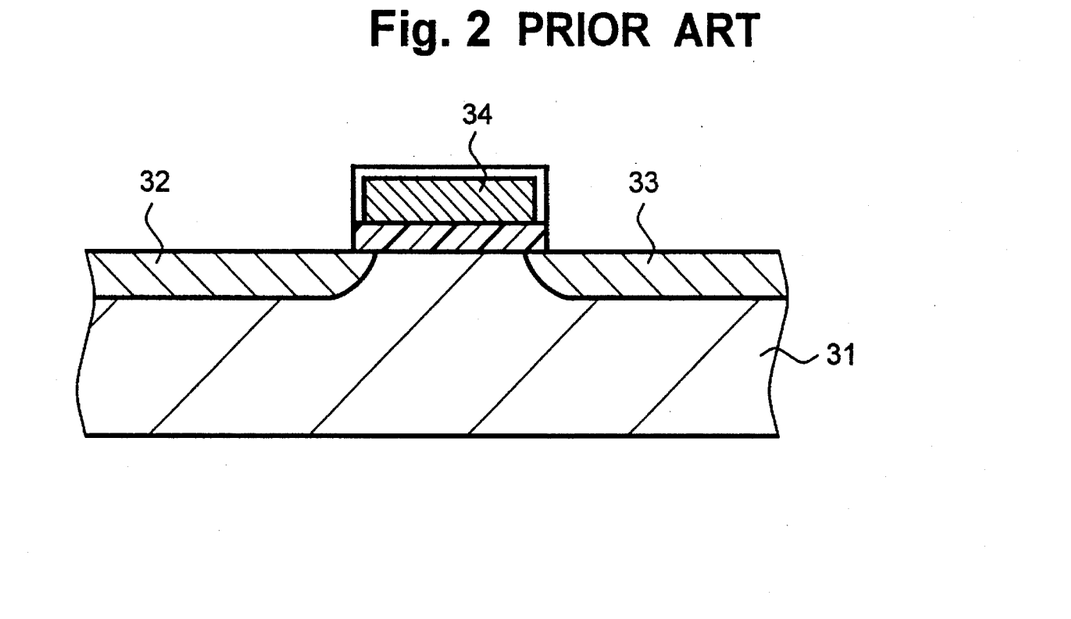
FIG. 2 is a diagrammatic sectional view of a memory element of an N-channel enhancement-mode MOSFET of the device of FIG. 1.
Figure 3:
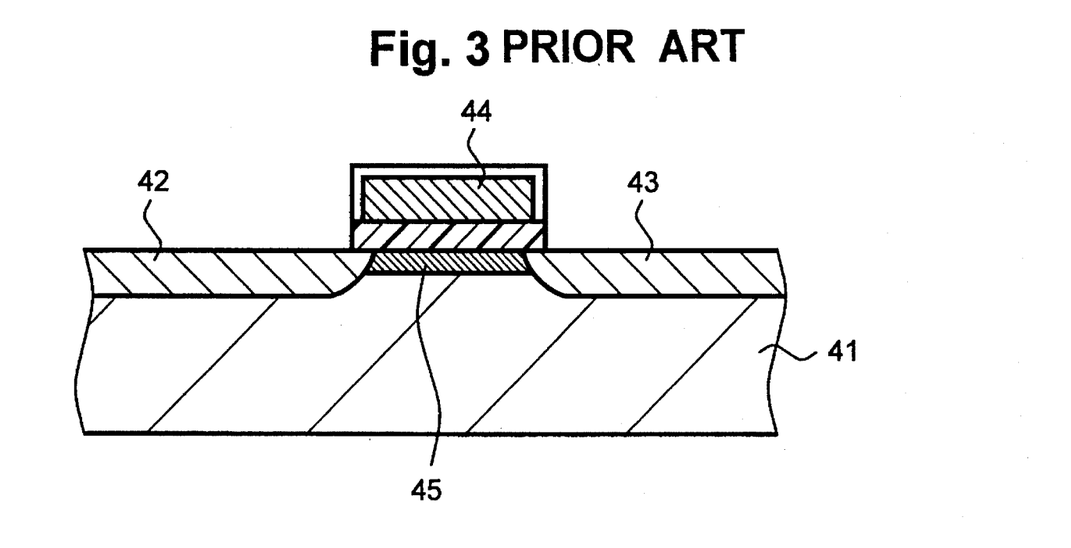
FIG. 3 is a diagrammatic sectional view of a memory element of an N-channel depletion-mode MOSFET.

An N-channel enhancement-mode MOSFET is illustrated in a cross sectional view in FIG. 2 and an N-channel depletion-mode MOSFET is illustrated in a cross sectional view in FIG. 3. In the N-channel enhancement-mode MOSFET shown in FIG. 2, there are a source diffusion layer 32 and a drain diffusion layer 33 on a P-type semiconductor substrate 31 and a gate electrode 34 over a channel region between these diffusion layers. Referring to FIG. 3, in the N-channel depletion-mode MOSFET in which the threshold voltage is negative, there are a source diffusion layer 42 and a drain diffusion layer 43 on a P-type semiconductor substrate 41, a phosphorus diffused channel region 45 formed between the diffusion layers, and a gate electrode 44 formed over the phosphorus diffused channel region 45. Either of the modes, i.e., enhancement-mode or depletion-mode, is selected depending on the kinds of the data to be stored.

Figure 4:
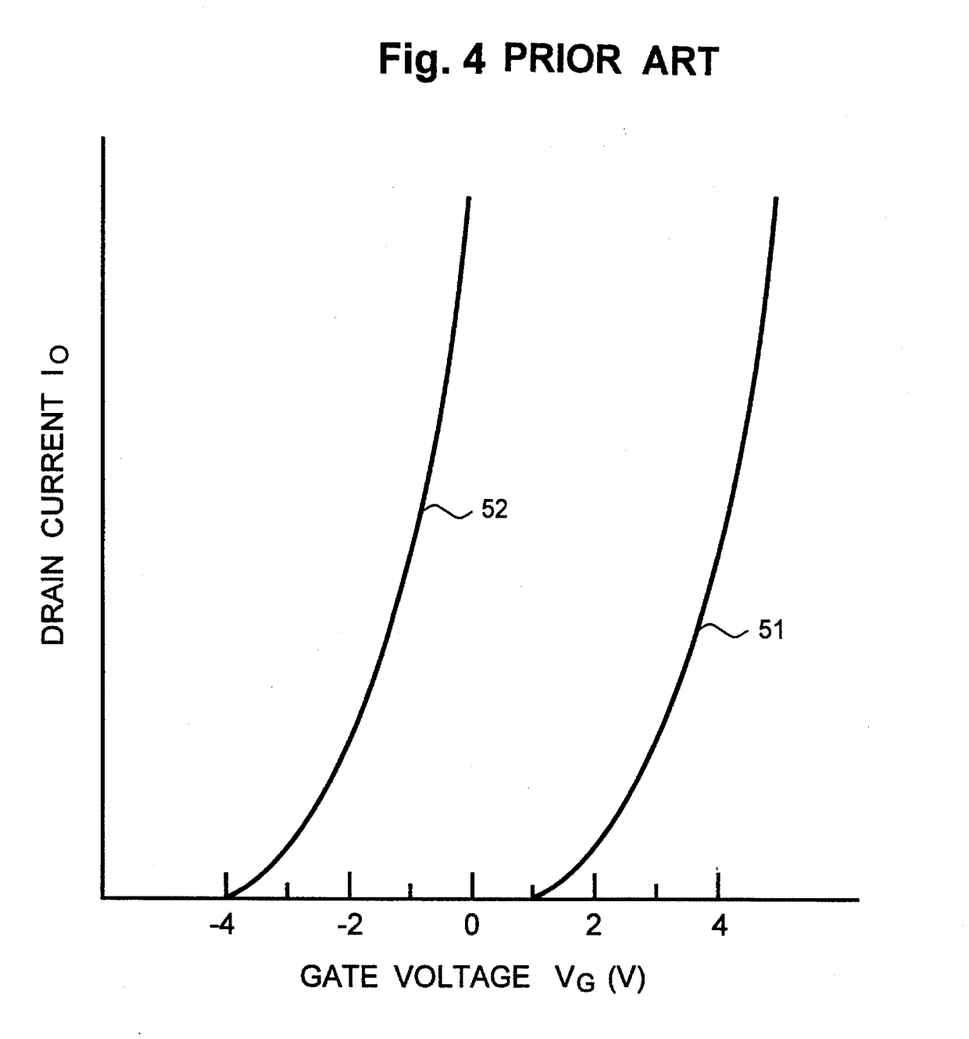
FIG. 4 is a graph showing characteristics of gate voltages versus drain currents of the respective memory elements shown in FIGS. 2 and 3.

The characteristics of the gate voltage versus the drain current of the typical MOSFET are shown in FIG. 4. The N-channel enhancement-mode MOSFET in which the threshold voltage is a positive voltage and has a characteristic curve 51 turns to a conductive state when the gate voltage becomes 1 volt and above. On the other hand, the N-channel depletion-mode MOSFET in which the threshold voltage is a negative voltage and has a characteristic curve 52 turns to a conductive state when the gate voltage becomes −4 volts and above.

During the reading of data from the above memory element, where the gate voltage $V_G$ is 0 volt ($V_G$=0 V), since the N-channel enhancement-mode MOSFET becomes non-conductive whereas the N-channel depletion-mode MOSFET becomes conductive, the potential of the column line connected to this memory element changes so that it is possible to read the data by detecting a minute voltage change. A sense amplifier circuit operates to detect this minute voltage change.

An example of the conventional semiconductor device as described above has been disclosed in Japanese Patent Application Kokai Publication No. Hei 5-182487.

Figure 1:
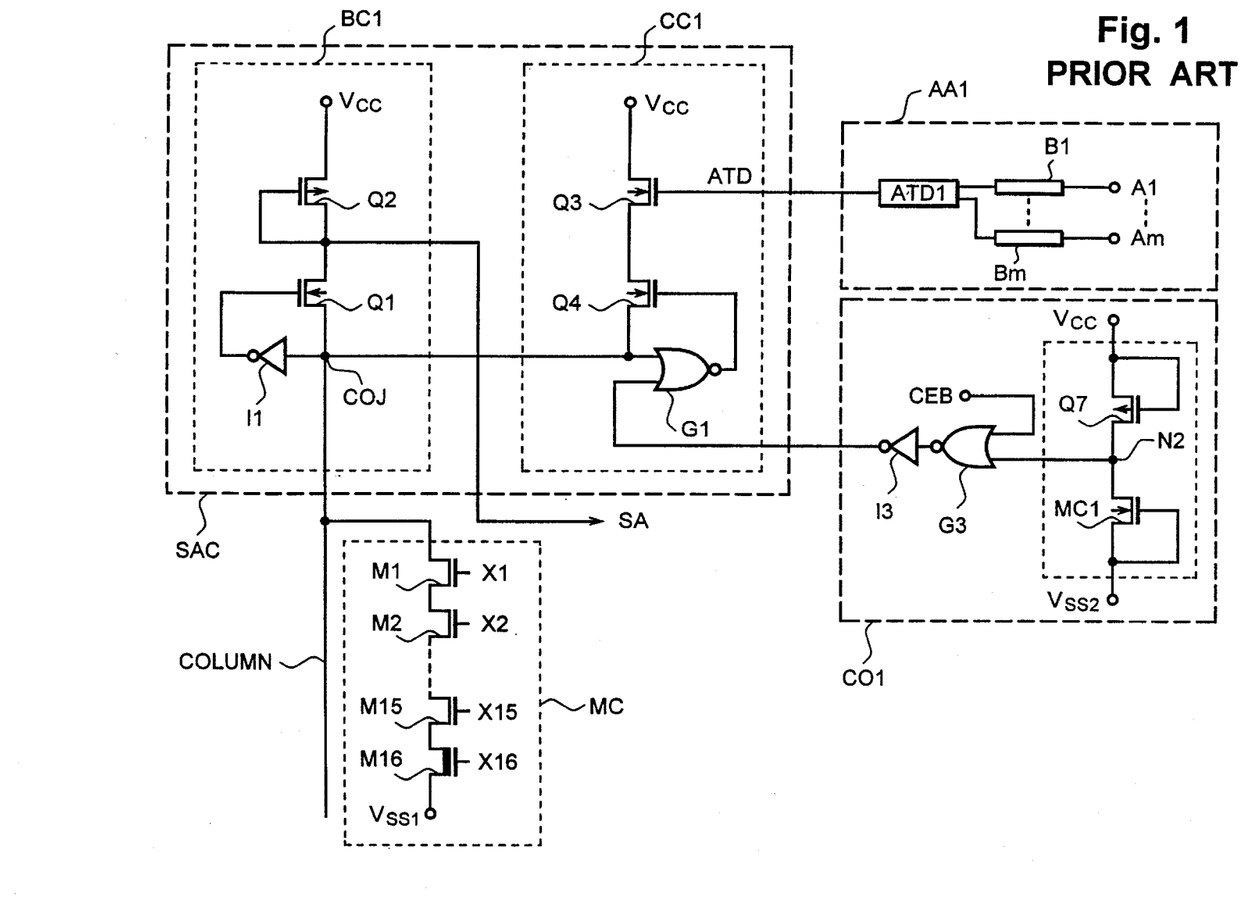
FIG. 1 is a circuit diagram showing essential elements of a prior art semiconductor device.

Of the semiconductor device disclosed in the above publication, the main portion thereof is shown in FIG. 1. As shown in FIG. 1, the sense amplifier and the peripheral circuits are provided with a sense amplifier circuit section SAC consisting of a bias circuit BC1 and a charging circuit CC1, an address transition detecting circuit section (hereinafter referred to as ATD circuit section), and a control circuit section CO1.

The bias circuit BC1 is arranged such that a P-channel MOSFET Q2 as a load element and an N-channel MOSFET Q1 are inserted in series between a power supply terminal $V_{CC}$ and a column line COLUMN, and the source electrode of the N-channel MOSFET Q1 connected to the column line is also connected to an input terminal of an inverter I1. An output terminal of the inverter I1 is connected to a gate electrode of the N-channel MOSFET Q1 and a sense output SA of the sense amplifier is taken out from the drain electrode of the N-channel MOSFET Q1.

In the charging circuit CC1, an N-channel MOSFET Q3 and an N-channel MOSFET Q4 are inserted between the power supply terminal $V_{CC}$ and the column line, and the source electrode of the N-channel MOSFET Q4 connected to the column line is also connected to one input terminal of a NOR gate G1. The output terminal of this NOR gate G1 is connected to the gate electrode of the N-channel MOSFET Q4 and the output terminal of the control circuit section CO1 is connected to the other input terminal of the NOR gate G1. The output signal line ATD of the ATD circuit section AA1 is connected to the gate electrode of the N-channel MOSFET Q3.

The control circuit section CO1 is provided with a memory element MC1 which has the same configuration as the read only memory element as shown in FIGS. 2 and 3. The P-channel MOSFET Q7 and the N-channel MOSFET MC1 are inserted between the power supply terminal $V_{CC}$ and the ground potential terminal $V_{SS2}$, and the gate electrodes are connected to the respective source electrodes. The drain electrode of the N-channel MOSFET MC1 is connected to one input terminal of the NOR gate G3 and the inverted signal CEB of a semiconductor device enabling signal (hereinafter referred to as "chip enable signal") is inputted to the other input terminal of the NOR gate G3. The output terminal of the NOR gate G3 is connected to the input terminal of the inverter I3, and the output of the control circuit section CO1 is taken out from the output terminal of the inverter I3 and is supplied to the NOR gate G1.

At the ATD circuit section AA1, output terminals of the address buffers B1–Bm which supply external address signals A1–Am are respectively connected to input terminals of the address transition detecting circuit ATD1, and the output signal line ATD is taken out from an output terminal thereof.

The memory cell block MC is connected such that, for example, memory cells M1–M16 are connected in series between the column line and the ground potential terminal $V_{SS1}$.

The sense amplifier circuit and the peripheral circuits having the above construction output data as sense amplifier outputs SA in response to a conductive state or a non-conductive state of the memory cells connected in parallel with the column lines.

Next, the operation of the conventional sense amplifier and the peripheral circuits is explained. First, when the inverted signal CEB of the chip enable signal for enabling the overall semiconductor device, which is applied to one input terminal of the NOR gate G3 of the control circuit CO1 is high in a logical level, that is, when the semiconductor device is in an inactivated state, the output of the NOR gate G3 does not depend on the level of the other input terminal so as to be always low in a logical level, and a high level signal is supplied to the NOR gate G1 as one input signal through the inverter I3.

Thus, since the output of the NOR Gate G1 does not depend on the other input signal and is always at a low level, the N-channel MOSFET Q4 is always in a non-conductive state. That is, it is arranged such that the charging circuit CC1 becomes an inactivated state when the semiconductor device is in the inactivated state.

Next, when the inverted signal CEB of the chip enable signal which is inputted to the NOR Gate G3 as one input signal is at a low level, that is, when the semiconductor device is in an activated state, the output level of the NOR gate G3 is such that it depends on the level of the other input signal (the level at the node N2).

First, when the memory element MC1 is of an N-channel enhancement-mode MOSFET and the semiconductor device is in the activated state, the memory element MC1 is in the inactivated state since the gate electrode thereof is of a ground potential, and one input terminal of the NOR gate G3 receives the signal CEB and the other input terminal thereof receives a high level signal because of the P-channel MOSFET Q7 which functions as a load. For this reason, the output of the NOR gate G3 always becomes a low level without depending on the one input signal CEB so that, when the high level signal is inputted to the NOR gate G1 through the inverter I3, the output of the NOR gate G1 always becomes a low level and the N-channel MOSFET Q4 turns to a non-conductive state, whereby the charging circuit CC1 becomes an inactivated and non-operating state. Thus, the sense amplifier circuit section SAC is caused to be operated solely by the bias circuit BC1.

Next, when the memory element MC1 is of the N-channel depletion-mode MOSFET and the semiconductor device is in an activated state, if the mutual transfer conductance of the memory element MC1 is designed sufficiently large as compared with that of the P-channel MOSFET Q7, one of the input signals applied to the NOR gate G3 becomes a low level. Here, since the signal CEB is also at a low level, the output of the NOR gate G3 becomes a high level, and the signal of a low level is supplied to the NOR gate G1 through the inverter I3.

For the above reason, the charging circuit CC1 becomes an activated state so that, depending on the data inputted to an input node COJ of the bias circuit BC1 which is the other of the inputs to the NOR gate G1, the signal of a high level or a low level is outputted therefrom and, in response thereto, the N-channel MOSFET Q4 turns to either a conductive state or a non-conductive state.

The operation of the sense amplifier circuit section SAC at this time is explained as follows. First, the memory cells selected become conductive, that is, by reference to FIG. 1, the signals X1–X15 supplied to the gate electrodes of the memory cells M1–M15 constituted by the N-channel enhancement-mode MOSFETs are at high levels and the signal X16 supplied to the Gate electrode of the memory cell M16 constituted by the N-channel depletion-mode MOSFET is at a low level, the memory cells all become conductive and, as a consequence, the current flows from the column line to the ground potential terminal $V_{SS1}$ through the memory cells and the potential at the input node COJ of the sense amplifier circuit section SAC is discharged and falls.

When the potential at the input node COJ of the sense amplifier circuit section SAC falls below the logical threshold values of the inverter I1 and the NOR gate G1, the outputs of the inverter I1 and the NOR Gate G1 turn to high levels, and both the N-channel MOSFETs Q1 and Q4 become conductive. Therefore, the sense output signal SA of the sense amplifier circuit section SAC is charged by the P-channel MOSFET Q2 functioning as a load and becomes a high level. At this time, if the pulse signal is generated from the ATD circuit section AA1, the N-channel MOSFET Q3 is in a conductive state during the period in which the pulse signal is at a high level, and the column line is charged until the potential at the column line reaches the logical threshold voltages of the inverter I1 and the NOR gate G1 or until the pulse signal becomes a low level.

As explained above, the charging capability of the sense amplifier can be changed depending on whether data is written in the memory element MC1 during the fabrication process. In the semiconductor device in which the sense amplifier circuit and the peripheral circuits having configurations as explained above are used, in the case where the power supply voltage in operation is 5 volts, generally the memory element MC1 employs an N-channel enhancement-mode MOSFET and is optimally designed so that the bias circuit section BC1 operates fast and stably. On the other hand, where the power supply voltage in operation is 3 volts or in a vicinity thereof, the biasing capability of the bias circuit BC1 lowers so that an optimal design for compensating the lowered capability is made such that the memory element MC1 employs the N-channel depletion-mode MOSFET and uses the charging circuit CC1.

The foregoing explanation distinguishes the operation by whether the data has been written in the memory element MC1. However, it is to be understood that the same effect can be attained when the signal supplied from the control circuit section CO1 to the NOR gate G1 is fixed to either the ground potential or the power supply potential.

For fabricating the above described conventional sense amplifier circuit, depending on whether the memory element MC1 employs either the N-channel enhancement-mode MOSFET or the N-channel depletion-mode MOSFET, it is necessary to change the mask patterns used in the lithography step during the fabrication of the semiconductor device. Thus, for the products with the power supply voltage of 5 volts and 3 volts, different masks must be prepared and used during the fabrication. Thus, a problem is that the fabrication requires an increased number of process steps and management steps.

Generally, in the mask ROM, an intermediate product (a product completed up to a step immediately preceding the writing-in of data) is fabricated and, after the data that the customer requires is received, the remaining steps including writing-in of data are carried out. Thus, a problem is that, in the case where the mask patterns are changed before the writing-in of the data, it is necessary that a variety of intermediate products be fabricated and prepared in advance, and this complicates the fabrication process management.

Further, where a mask pattern is used and an optimal value is once set with respect to either of the two different power supply voltages, it is not possible to change the optimal value to the other voltage unless a change is made again in the mask patterns.

SUMMARY OF THE INVENTION

An object of the present invention, therefore, is to overcome the problems existing in the prior art, and to provide a semiconductor device in which optimal performance characteristics can be attained without changing mask patterns for each operating power supply voltage even when there are differences in such an operating power supply voltage.

According to one aspect of the invention, there is provided a semiconductor device comprising:

a power supply terminal and a ground potential terminal;

a bias circuit which, while a first power supply voltage or a second power supply voltage higher than the first power supply voltage is supplied from the power supply terminal, supplies a bias voltage to memory cells connected in parallel to column lines;

an address transition detecting circuit which generates pulse signals by detecting changes in address signals;

a charging circuit which is connected in parallel with the bias circuit and which, while the second power supply voltage is being supplied and is in an activated state, compensates the bias voltage supplied to the column lines in response to the pulse signals generated from the address transition detecting circuit; and a control circuit connected between the power supply terminal and the ground potential terminal, which generates a control signal for enabling the charging circuit when used under the first power supply voltage, the control circuit operating such that, when a power supply voltage is switched from one to the other between the first power supply voltage and the second power supply voltage, the switched voltage, if this voltage is the first power supply voltage, inactivates the charging circuit and, if the voltage is the second power supply voltage, activates the charging circuit.

The control circuit may comprise a first N-channel depletion-mode MOSFET having a drain electrode and a gate electrode commonly connected to the power supply terminal; a second N-channel depletion-mode MOSFET having a gate electrode and a source electrode commonly connected to the ground potential terminal, and a drain electrode connected to a source electrode of the first N-channel depletion-mode MOSFET at a series junction node; a NOR gate having a first input terminal connected to the series junction node provided between the first and second N-channel depletion-mode MOSFETs, and a second input terminal for receiving an inverted signal of a semiconductor device enabling signal; and an inverter having an input terminal connected to an output terminal of the NOR gate and an output terminal for outputting the control signal for enabling the charging circuit.

In the semiconductor device according to the invention, the charging capability for the column line can be changed easily without the need of changing mask patterns. For example, where the bias circuit is designed as optimal when the power supply voltage is 5 volts and the charging circuit is designed as optimal when the power supply voltage is 3 volts, it is possible to obtain the optimal performance without the need of making any circuit changes or mask pattern changes even when the power supply voltages are different.

The semiconductor device according to the invention is provided with a bias circuit which supplies a bias voltage to the memory cells connected in parallel with the column lines, and a charging circuit which charges the column lines and, by these bias circuit and charging circuit, the conductive or non-conductive states of the memory cells are read out as data. The device is provided with a control circuit by which the charging circuit is controlled as to its activation and inactivation based on the result of the detection as to whether the power supply voltage is higher or lower than the predetermined voltage. Thus, even when there are differences in the power supply voltages supplied to the semiconductor device, it is not necessary to fabricate separate semiconductor devices by changing mask patterns of the control circuit for controlling the operation of the charging circuit corresponding to the respective power supply voltages. That is, with the same and single semiconductor device, the optimal performance characteristics corresponding to a wide range of the power supply voltages can be obtained.

Thus, the arrangement according to the present invention overcomes the problem existed in the prior art, that is, once the optimal value is set to whichever value of the power supply voltages by changing the mask pattern, it is not possible to make a change to the optimal value in another power supply voltage without changing the mask pattern again.

According to the invention, since the products are not made tailored to the power supply voltages during the fabrication, there is no increase in intermediate products or in kinds of mask patterns, so that the invention is effective in reducing development steps and production cost, and in increasing production management efficiency.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embedments of the semiconductor devices according to the invention will be explained hereunder with reference to the accompanying drawings.

Figure 5:
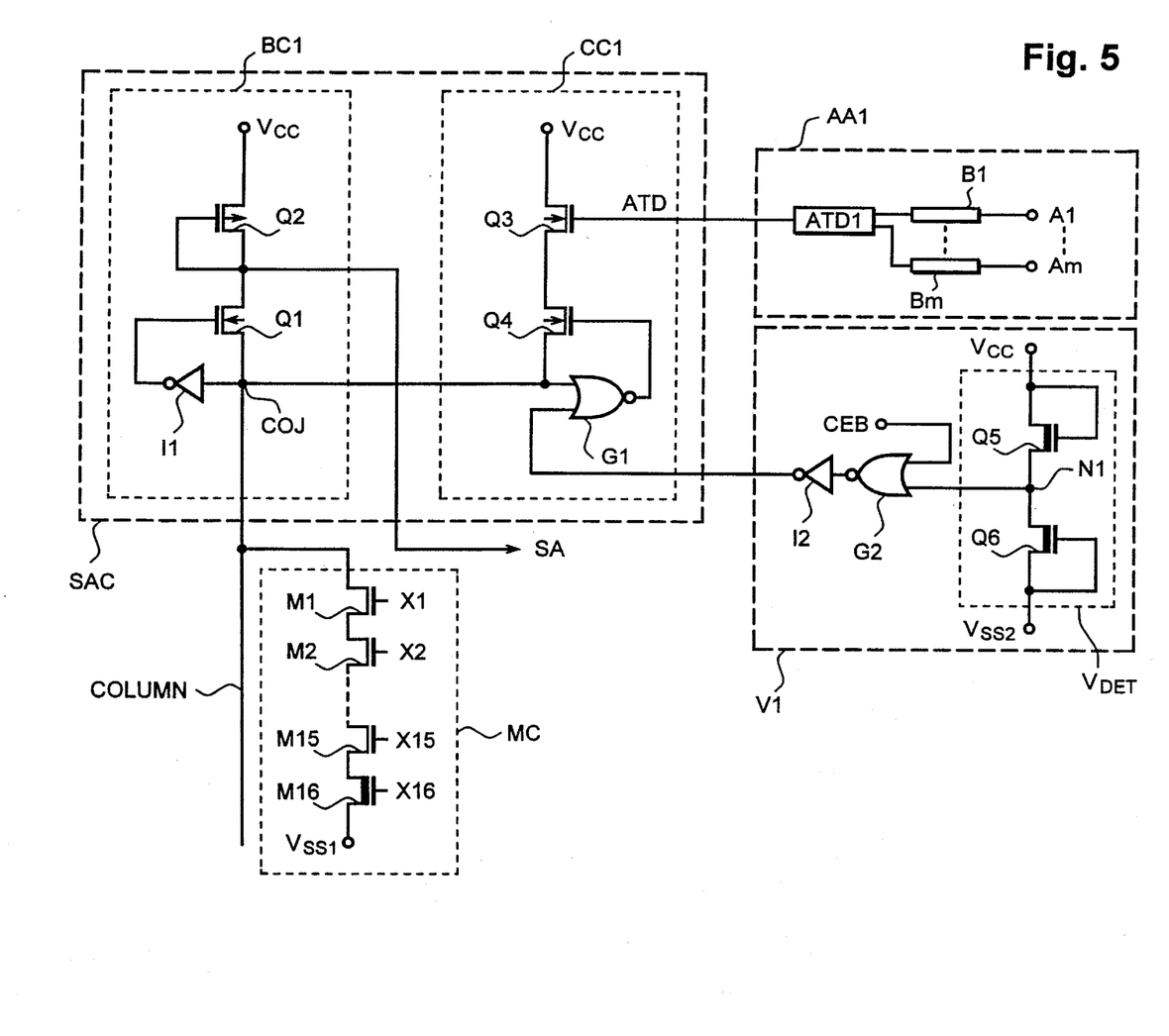
FIG. 5 is a circuit diagram showing essential elements of a semiconductor device of a first embodiment according to the invention.

FIG. 5 shows a circuit diagram of the semiconductor device of the first embodiment according to the invention. The difference of this embodiment from the conventional semiconductor device shown in FIG. 1 is that a control circuit section V1 is used instead of the control circuit section CO1 in the conventional device. Since the circuit configuration other than the above of this embodiment is the same as that of the conventional device, the explanation thereof is not repeated here.

The semiconductor device of this embodiment is provided with a sense amplifier circuit section SAC, a memory cell block MC, an address transition detecting (ATD) circuit section AA1 for generating pulse signals based on the detection of the changes in the addresses, and a control circuit section V1.

The control circuit section V1 comprises a supply voltage detection circuit $V_{DET}$ connected between the power supply terminal $V_{CC}$ and the ground potential terminal $V_{SS2}$, a NOR gate G2, and an inverter I2. The supply voltage detection circuit $V_{DET}$ is formed by two N-channel depletion-mode MOSFETs Q5 and Q6 each having the same structure as that of the read only memory element shown in FIG. 3 wherein phosphorus (P) is diffused in the channel region below the gate electrode. The N-channel depletion-mode MOSFET Q5 has its gate and drain commonly connected to the power supply terminal $V_{CC}$ and its source connected to the drain of the N-channel depletion-mode MOSFET Q6 at the series junction node N1. The N-channel depletion-mode MOSFET Q6 has its gate and source commonly connected to the ground potential terminal $V_{SS2}$. The NOR gate G2 has one input terminal connected to the series junction node N1 and the other input terminal connected to the signal line of the inverted signal CEB of the chip enable signal. The output terminal of the NOR gate G2 is connected to the input terminal of the inverter I2 and the enabling control signal is outputted from the output terminal of the inverter I2.

Next, operation of the semiconductor device of the first embodiment as constructed above is explained. First, in the case where the power supply voltage $V_{CC}$ is 5 volts ($V_{CC}$=5 V) and the level of the inverted signal CEB of the chip enable signal which is applied to the NOR gate G2 as one input signal is high, that is, in the inactivated state of the semiconductor device, the output level of the NOR gate G2 becomes low because it does not depend on the level of the other input signal (the potential at the series junction node N1), so that a high level signal is supplied to the NOR gate G1 of the charging circuit CC1 through the inverter I2. Since the operation of the sense amplifier circuit section SAC at this time is the same as that in the conventional device, explanation thereof is not repeated here.

On the other hand, in the case where the level of the inverted signal CEB of the chip enable signal applied to the NOR gate G2 as one input signal is low, that is, in the state of the activated state of the semiconductor device, the output level of the NOR gate G2 depends on the level of the other input signal, that is, the potential at the series junction node N1.

First, the N-channel depletion-mode MOSFET Q6 functions as a constant-current source because its gate and source electrodes are commonly connected to the ground potential terminal $V_{SS2}$, while the N-channel depletion-mode MOSFET Q5 functions as a source-follower whose voltage is proportional to the supply voltage because its gate and drain electrodes are commonly connected to the power supply terminal $V_{CC}$.

The circuit is so designed that the potential at the series junction node N1 becomes equal to the logical threshold voltage of the NOR gate G2 when the level of the power supply voltage $V_{CC}$ is in the order of 4 volts.

Next, the operation when the power supply voltage is changed is explained hereunder.

First, in the case of $V_{CC}$=5 V, since the potential at the node N1 is higher than the logical threshold voltage of the NOR gate G2, the level of the NOR gate G2 to which the node N1 potential is applied as one input signal becomes low and, therefore, a high level signal is supplied to the one input terminal of the NOR gate G1 through the inverter I2.

As a result, since the output level of the NOR gate G1 becomes low irrespective of the level of the other input signal applied to the NOR gate G1, the N-channel MOSFET Q4 becomes non-conductive, whereby the charging circuit CC1 is inactivated. As a result, the potential at the input node COJ of the sense amplifier circuit section SAC, which node is connected to the column line, is determined by the bias circuit BC1. Since the operation of the sense amplifier circuit section SAC at this time is the same as that in the conventional device, explanation thereof is not repeated here.

Next, in the case where the power supply voltage $V_{CC}$ is reduced to 3 volts from 4 volts, since the potential at the series junction node N1 becomes lower than the logical threshold voltage of the NOR gate G2 and also the inverted signal CEB of the chip enable signal is at a low level, the output level of the NOR gate G2 becomes high so that the low level signal is supplied to the one input terminal of the NOR gate G1 through the inverter I2. Since the potential at the input node COJ of the sense amplifier circuit section SAC, the potential being applied to the NOR gate G1 as the other input signal, is at a low level because of the power supply voltage reduction to 3 volts, the output level of the NOR gate N1 becomes high so that the N-channel MOSFET Q4 becomes a conductive state. As a result, when the level of the signal of the output signal line ATD from the address transition detecting circuit section AA1, the signal being applied to the gate of the N-channel MOSFET Q3 is high, the charging circuit CC1 is activated.

Therefore, the potential at the input node COJ of the sense amplifier circuit section SAC is charged up by the charging circuit CC1 and, the semiconductor device continues a normal operation accordingly. Since the operation of the sense amplifier circuit section SAC at this time is the same as that of the conventional device, the explanation thereof is not repeated here.

As explained hereinabove, when the power supply voltage $V_{CC}$ is 5 volts ($V_{CC}$=5 V), the charging circuit CC1 is inactivated and a bias voltage is supplied to the column line COLUMN from the bias circuit BC1, whereas, when the power supply voltage $V_{CC}$ is reduced to 3 volts ($V_{CC}$=3 V), though the bias voltage of the bias circuit BC1 is reduced by the amount of the threshold voltage of the P-channel MOSFET Q2, the charging circuit CC1 is activated so that the reduced voltage is compensated.

Figure 6:
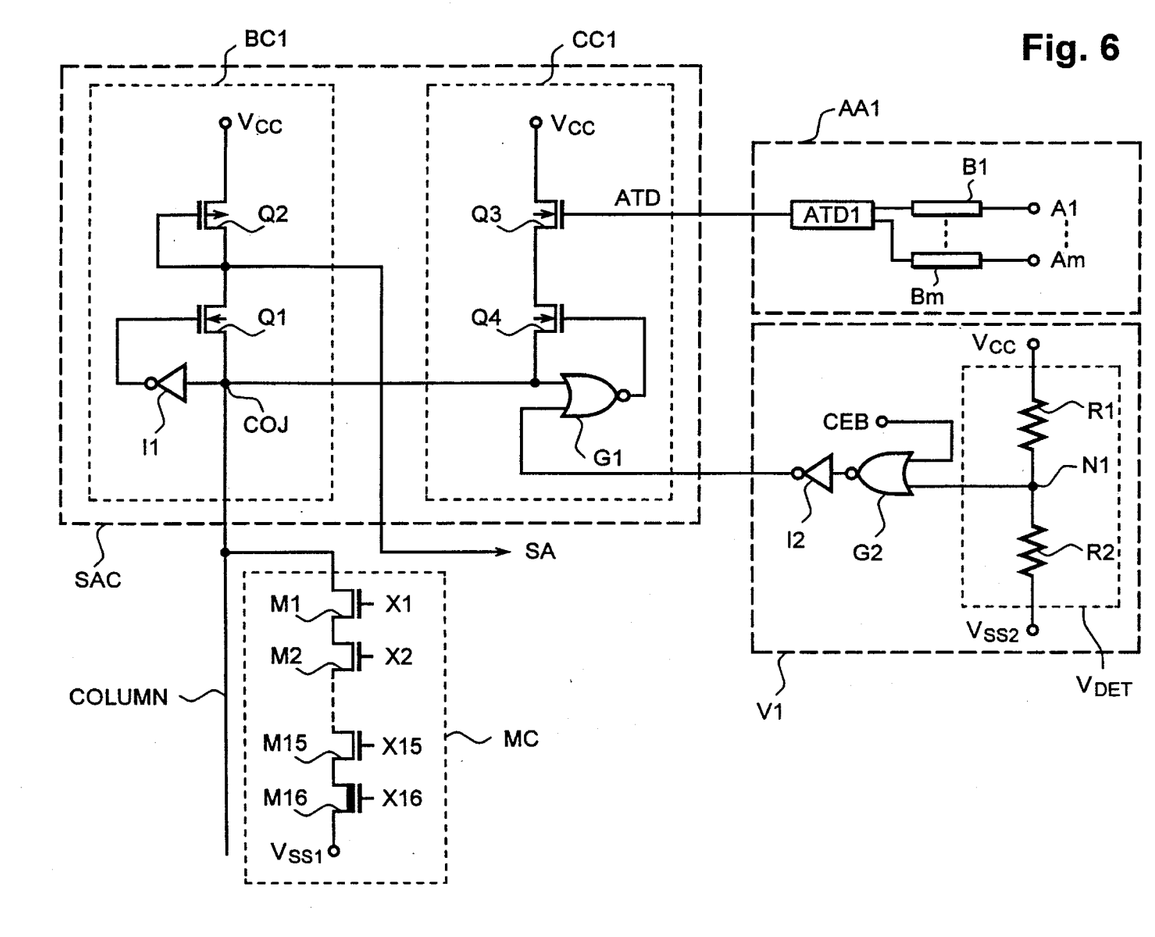
FIG. 6 is a circuit diagram showing essential elements of a semiconductor device of a second embodiment according to the invention.

FIG. 6 shows a semiconductor device of the second embodiment according to the present invention. The only difference of this second embodiment from the above explained first embodiment resides in that two resistors R1 and R2 are used instead of the two N-channel depletion-mode MOSFETs Q5 and Q6 provided in the supply voltage detection circuit $V_{DET}$ in the control circuit section V1 of the first embodiment.

Specifically, in the control circuit section V1 of this second embodiment, two resistors R1 and R2 are connected in series between the power supply terminal $V_{CC}$ and the ground potential terminal $V_{SS2}$. The series junction node N1 between the resistors R1 and R2 is connected to one input terminal of the NOR gate G2. The other input terminal of the NOR gate G2 is connected to the signal line of the inverted signal CEB of the chip enable signal. The output terminal of the NOR gate G2 is connected to the input terminal of the inverter I2, and the output terminal of the inverter I2 outputs an enabling control signal.

As is the case in the first embodiment, the circuit is so designed that the potential at the series junction node N1 is the same value as that of the logical threshold voltage of the NOR gate G2 when the power supply voltage $V_{CC}$ is in the order of 4 volts.

The operation of this second embodiment having the above explained circuit construction is the same as that of the first embodiment. Specifically, when the power supply voltage $V_{CC}$ is 5 volts ($V_{CC}$=5 V), the charging circuit CC1 is inactivated and a bias voltage is supplied to the column line COLUMN from the bias circuit BC1, whereas, when the power supply voltage $V_{CC}$ is reduced to 3 volts ($V_{CC}$=3 V), though the bias voltage of the bias circuit BC1 is reduced by the amount of the threshold voltage of the P-channel MOSFET Q2, the charging circuit CC1 is activated so that the reduced voltage is compensated.

As can be readily understood from the above explanation, according to the invention, in the case where the power supply voltage $V_{CC}$ supplied to the semiconductor device differs between 5 volts and 3 volts, it is not necessary to change the mask patterns for the control circuit section V1 which controls the operation of the charging circuit CC1 according to the supply voltage to be used and to produce different semiconductor devices. In the semiconductor device according to the invention, with the same and single semiconductor device, the optimal performance characteristics corresponding to a wide range of the power supply voltages can be obtained.

Though the above illustrated embodiments respectively refer to sixteen-stages laterally stacked mask ROM wherein sixteen memory cells M1 to M16 as a one memory block MC are connected in series in the memory cell array, the invention is not limitative to the sixteen stages laterally stacked as one block configuration. For example, 32 stages, 8 stages, 4 stages, 2 stages or one stage may be adopted as the memory cell block MC.

Further, an erasable and electrically programmable read only memory (EPROM) cell or an electrically erasable programmable read only memory (Flash EEPROM) cell can be used as a memory cell.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor device comprising:

a power supply terminal and a ground potential terminal;

a bias circuit which, while a first power supply voltage or a second power supply voltage higher than said first power supply voltage is supplied from said power supply terminal, supplies a bias voltage to memory cells connected in parallel to column lines;

an address transition detecting circuit which generates pulse signals by detecting changes in address signals;

a charging circuit which is connected in parallel with said bias circuit and which, while said second power supply voltage is being supplied and is in an activated state, compensates said bias voltage supplied to said column lines in response to said pulse signals generated from said address transition detecting circuit; and a control circuit having a supply voltage detection circuit which is connected between said power supply terminal and said ground potential terminal, and which generates a control signal for enabling said charging circuit when used under said first power supply voltage, said supply voltage detection circuit operating such that, when a power supply voltage is switched from one to the other between said first power supply voltage and said second power supply voltage, the switched voltage, if this voltage is said first power supply voltage, inactivates said charging circuit and, if the voltage is said second power supply voltage, activates said charging circuit.

2. A semiconductor device according to claim 1, in which said supply voltage detection circuit comprises:

a first N-channel depletion-mode MOSFET having a drain electrode and a gate electrode commonly connected to said power supply terminal; and a second N-channel depletion-mode MOSFET having a gate electrode and a source electrode commonly connected to said ground potential terminal, and a drain electrode connected to a source electrode of said first N-channel depletion-mode MOSFET at a series junction node;

said control circuit including a NOR gate having a first input terminal connected to said series junction node provided between said first and second N-channel depletion-mode MOSFETs and a second input terminal for receiving an inverted signal of a semiconductor device enabling signal, and an inverter having an input terminal connected to an output terminal of said NOR gate and an output terminal for outputting said control signal for enabling said charging circuit.

3. A semiconductor device according to claim 2, in which a transistor size of each of said first and second N-channel depletion-mode MOSFETs is set such that, when a potential of said power supply voltage is about intermediate potential between said first and second power supply voltages, a potential at said series junction node becomes equal to a threshold voltage of said NOR gate.

4. A semiconductor device according to claim 1, in which said supply voltage detection circuit comprises a first resistor and a second resistor connected in series between said power supply terminal and said ground potential terminal, said control circuit including a NOR gate having a first input terminal connected to a series junction node provided between said first and second resistors and a second input terminal for receiving an inverted signal of a semiconductor device enabling signal, and an inverter having an input terminal connected to an output terminal of said NOR gate and an output terminal for outputting said control signal for enabling said charging circuit.

5. A semiconductor device according to claim 4, in which a resistance value of each of said first and second resistors is set such that, when a potential of said power supply potential is about intermediate potential between said first and second power supply voltages, a potential at said series junction node becomes equal to a threshold voltage of said NOR gate.

* * * * *